(12) United States Patent
Uchino et al.

(10) Patent No.: US 10,268,081 B2
(45) Date of Patent: *Apr. 23, 2019

(54) LIQUID CRYSTAL DISPLAY DEVICE AND MANUFACTURING METHOD THEREOF

(71) Applicants: JAPAN DISPLAY INC., Tokyo (JP); PANASONIC LIQUID CRYSTAL DISPLAY, CO., LTD., Himeji-shi, Hyogo-ken (JP)

(72) Inventors: Shoichi Uchino, Annaka (JP); Noboru Kunimatsu, Chiba (JP); Hidehiro Sonoda, Mobara (JP); Chikae Matsui, Mobara (JP); Yuko Matsumoto, Onjuku (JP); Tomio Yaguchi, Sagamihara (JP); Toshiki Kaneko, Chiba (JP); Jun Tanaka, Kawasaki (JP)

(73) Assignees: Japan Display Inc., Tokyo (JP); Panasonic Liquid Crystal Display, Co., Ltd., Himeji-shi (JP)

( * ) Notice: Subject to any disclaimer, the term of this patent is extended or adjusted under 35 U.S.C. 154(b) by 671 days.

This patent is subject to a terminal disclaimer.

(21) Appl. No.: 14/246,787

(22) Filed: Apr. 7, 2014

(65) Prior Publication Data

US 2014/0220848 A1 Aug. 7, 2014

Related U.S. Application Data

(63) Continuation of application No. 12/943,190, filed on Nov. 10, 2010, now Pat. No. 8,692,970.

(30) Foreign Application Priority Data

Nov. 13, 2009 (JP) ................... 2009-260076

(51) Int. Cl.
*G02F 1/1337* (2006.01)
*G02F 1/13* (2006.01)
*G02F 1/1333* (2006.01)

(52) U.S. Cl.
CPC .......... *G02F 1/133788* (2013.01); *G02F 2001/1316* (2013.01); *G02F 2001/133354* (2013.01); *Y10T 428/1023* (2015.01)

(58) Field of Classification Search
CPC .............................................. Y10T 428/1023
See application file for complete search history.

(56) References Cited

U.S. PATENT DOCUMENTS 4,861,663 A * 8/1989 Sirinyan .................. C08J 7/02
427/302
6,001,277 A 12/1999 Ichimura et al.
(Continued)

FOREIGN PATENT DOCUMENTS

JP 2001-290155 10/2001
JP 2003-255349 9/2003
(Continued)

OTHER PUBLICATIONS

JA 61-7932 A to Abe et al., Pub. Date Mar. 8, 1986, (abstract).*
(Continued)

*Primary Examiner* — Edward J Glick
*Assistant Examiner* — Anthony G. Quash
(74) *Attorney, Agent, or Firm* — Typha IP LLC

(57) ABSTRACT

Disclosed is a manufacturing method of a liquid crystal display device which is a manufacturing method of a liquid crystal display device including a liquid crystal alignment film to which an alignment regulating force is imparted by a photo-alignment treatment, including: a film forming step of forming a film containing a polymer whose main chain is cleaved by irradiation with light; a photo-alignment step of
(Continued)

imparting an alignment regulating force to the film formed in the film forming step by irradiation of the film with light in an atmosphere of a temperature lower than 100° C.; and a removing step of removing a low-molecular weight component generated by cleaving the main chain of the polymer through the light irradiation after the light irradiation. Also disclosed is a liquid crystal display device manufactured by the manufacturing method.

12 Claims, 3 Drawing Sheets

(56) References Cited

U.S. PATENT DOCUMENTS

| | | | | |
|---|---|---|---|---|
| 6,034,754 | A * | 3/2000 | Sato | G02F 1/13363 349/102 |
| 8,692,970 | B2 * | 4/2014 | Uchino | G02F 1/133788 349/124 |
| 2003/0113484 | A1 * | 6/2003 | Mizusaki | G02F 1/133753 428/1.2 |
| 2006/0051525 | A1 * | 3/2006 | Tsutsui | G02F 1/133711 428/1.26 |
| 2006/0257589 | A1 | 11/2006 | Hayashi et al. | |
| 2007/0088125 | A1 | 4/2007 | Komitov et al. | |
| 2007/0091236 | A1 * | 4/2007 | Yano | G02B 5/3033 349/117 |
| 2007/0148369 | A1 * | 6/2007 | Sakai | C09K 19/54 428/1.2 |
| 2007/0153184 | A1 * | 7/2007 | Ham | G02F 1/133788 349/126 |
| 2008/0231786 | A1 * | 9/2008 | Shin | G02F 1/133723 349/124 |
| 2009/0103018 | A1 * | 4/2009 | Matsumori | G02F 1/13363 349/96 |
| 2009/0226629 | A1 * | 9/2009 | Yen | C08J 7/04 427/510 |
| 2010/0073609 | A1 | 3/2010 | Matsumori et al. | |
| 2014/0248445 | A1 * | 9/2014 | Tomioka | G02F 1/133723 428/1.27 |

FOREIGN PATENT DOCUMENTS

| | | |
|---|---|---|
| JP | 2006-171304 | 6/2006 |
| JP | 2007-199681 | 8/2007 |
| JP | 2007-226097 | 9/2007 |

OTHER PUBLICATIONS

Partial Translation of Information Offer Form for Japanese Patent Application No. 2009-260076, dated Apr. 14, 2014.
K. Usami et al., Change of In-Plane Anisotropy of UV Irradiated Polyimide Films Caused by Washing Treatment, Molecular Crystals and Liquid Crystals, vol. 400, Issue 1, 2003, pp. 71-78.

* cited by examiner

LIQUID CRYSTAL DISPLAY DEVICE AND MANUFACTURING METHOD THEREOF

CROSS-REFERENCE TO RELATED APPLICATION

The present application is a Continuation application of U.S. Ser. No. 12/943,190 filed Nov. 10, 2010, the content of which is hereby incorporated by reference, which claims priority from Japanese application JP2009-260076 filed on Nov. 13, 2009, the content of which is hereby incorporated by reference into this application.

BACKGROUND OF THE INVENTION

1. Field of the Invention

The present invention relates to a liquid crystal display device and a manufacturing method thereof.

2. Description of the Related Art

A liquid crystal alignment film to be used in a liquid crystal display device is formed through an alignment treatment, i.e., a step of imparting the liquid crystal alignment capability. As for the alignment treatment, the development of a photo-alignment treatment has been advanced recently. The photo-alignment treatment is a method of imparting the liquid crystal alignment capability to the surface of an organic film by irradiation of the surface of the organic film formed on a surface of a substrate with substantially linearly polarized light.

As a related art, JP 2007-226097 A discloses a manufacturing method of a liquid crystal display device using a liquid crystal display panel which enables high-definition display by preventing a decrease in the alignment control ability. More specifically, JP 2007-226097 A discloses a method of imparting alignment anisotropy to a film by irradiation of the film with polarized ultraviolet light while heating to 100° C. or higher in a photo-alignment treatment.

Further, JP 2003-255349 A discloses a method of forming a liquid crystal alignment film having alignment anisotropy by irradiation of a polyamic acid thin film with polarized ultraviolet light, followed by conversion of polyamic acid into a polyimide.

SUMMARY OF THE INVENTION

However, a liquid crystal alignment film formed with a photo-alignment agent or by a photo-alignment treatment disclosed in JP 2007-226097 A or JP 2003-255349 A has a problem that the alignment anisotropy is low. The fact that the alignment anisotropy is low means that the liquid crystal alignment regulating force is weak. A liquid crystal display device having a liquid crystal alignment film with a weak liquid crystal alignment regulating force has a problem that the image characteristic of a liquid crystal component cannot be sufficiently obtained.

The present inventors found that such a decrease in the alignment regulating force is caused as follows. A polymer which photodegrades in a photo-alignment treatment produces a low-molecular weight component, which remains in a liquid crystal alignment film and causes a decrease in the alignment regulating force and also causes a decrease in the image characteristic of a liquid crystal component.

Therefore, an object of the invention is to provide a liquid crystal display device using a liquid crystal alignment film formed by a photo-alignment treatment in which the alignment anisotropy of the liquid crystal alignment film is increased. The above and other objects and novel characteristics of the invention will be apparent from the description of this specification and the accompanying drawings.

A manufacturing method of a liquid crystal display device according to the invention is a manufacturing method of a liquid crystal display device including a liquid crystal alignment film to which the alignment regulating force is imparted by a photo-alignment treatment, and includes: a film forming step of forming a film containing a polymer whose main chain is cleaved by irradiation with light; a photo-alignment step of imparting the alignment regulating force to the film formed in the film forming step by irradiation of the film with light in an atmosphere of a temperature lower than 100° C.; and a removing step of removing a low-molecular weight component generated by cleaving the main chain of the polymer through the light irradiation after the light irradiation.

Further, in the removing step, the low-molecular weight component may be removed by heating the film after the light irradiation. Further, the heating in the removing step may be performed under a reduced pressure atmosphere.

Further, in the removing step, the low-molecular weight component may be removed by washing the film after the light irradiation. Further, the washing in the removing step may be performed using a solution containing a water-soluble organic solvent. Further, the washing in the removing step may be performed using a solution containing a surfactant.

Further, the polymer may be a compound represented by the following chemical formula (1). In the formula (1), R represents a divalent electron-donating organic group and n represents the number of repeating units of the polymer.

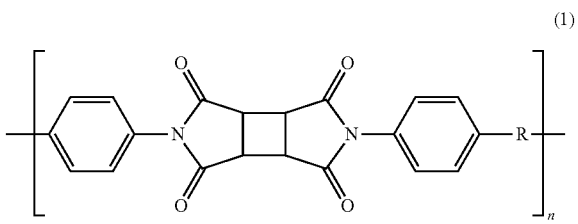

Further, the invention provides a liquid crystal display device manufactured by any of the above-mentioned respective manufacturing methods.

In the liquid crystal display device using a liquid crystal alignment film formed by a photo-alignment treatment, a decrease in the image characteristic of a liquid crystal component can be reduced.

DETAILED DESCRIPTION OF THE INVENTION

Figure 1:
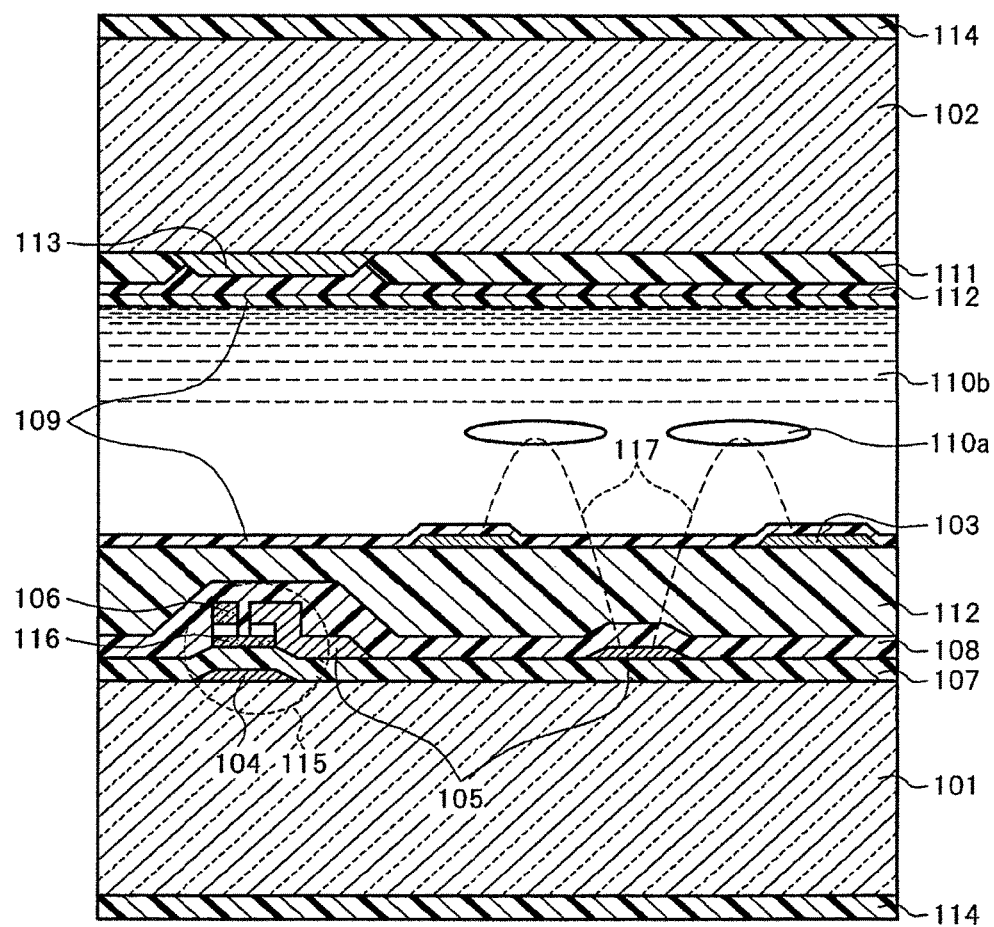
FIG. 1 is a cross-sectional view of a pixel portion illustrating the structure of a pixel of a liquid crystal display device according to an embodiment of the invention.

Hereinafter, embodiments of the invention will be described with reference to the drawings.

A manufacturing method of a liquid crystal display device according to an embodiment of the invention is a manufacturing method of a liquid crystal display device including a liquid crystal alignment film to which the alignment regulating force is imparted by a photo-alignment treatment, and includes: a film forming step of forming a film containing a polymer whose main chain is cleaved by irradiation with light; a photo-alignment step of imparting the alignment regulating force to the film formed in the film forming step by irradiation of the film with light in an atmosphere of a temperature lower than 100° C.; and a removing step of removing a low-molecular weight component generated by cleaving the main chain of the polymer through the light irradiation after the light irradiation.

The manufacturing method of a liquid crystal display device according to an embodiment of the invention may be, for example, a manufacturing method of an in-plane switching (IPS) mode liquid crystal display device, a vertically aligned (VA) mode liquid crystal display device, a twisted nematic (TN) mode liquid crystal display device, or a liquid crystal display device employing other driving mode.

For example, the manufacturing method of a liquid crystal display device according to an embodiment of the invention may be a manufacturing method of a liquid crystal display device including a pair of substrates at least one of which is transparent, a liquid crystal layer disposed between the pair of substrates, a group of electrodes formed on at least one of the pair of substrates to apply an electric field to the liquid crystal layer, and a liquid crystal alignment film to which the alignment regulating force is imparted by a photo-alignment treatment and which is disposed on at least one of the pair of substrates, and includes the above-mentioned film forming step, photo-alignment step, and removing step.

First, the polymer whose main chain is cleaved by irradiation with light according to the invention will be described. The polymer whose main chain is cleaved by irradiation with light according to the invention is a polymer which directly photodegrades. That is, the polymer absorbs light irradiated from outside and the polymer itself photodegrades.

Examples of the polymer whose main chain is cleaved by irradiation with light include polyimides. Further, among polyimides, a cyclobutane polyimide synthesized using cyclobutane tetracarboxylic acid dianhydride as a starting material is preferred.

Specific examples of the cyclobutane polyimide include a compound represented by the following chemical formula (1). The polymer in the manufacturing method of a liquid crystal display device according to an embodiment of the invention is preferably a compound represented by the following chemical formula (1).

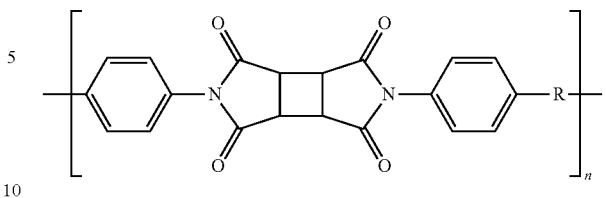

In the formula, R represents a divalent electron-donating organic group, and n represents the number of repeating units of the polymer and is preferably an integer of 100 to 1000.

When the compound represented by the above chemical formula (1) is irradiated with ultraviolet light, the compound represented by the above chemical formula (1) absorbs the ultraviolet light and undergoes a photodegradation reaction in which the ring structure of cyclobutane is opened and a maleimide end is generated.

When the photodegradation reaction of the compound represented by the above chemical formula (1) proceeds, a photodegradation product having a molecular weight lower than the compound represented by the above chemical formula (1), which initially has a high molecular weight, is generated.

Incidentally, the compound represented by the above chemical formula (1) is only an example illustrating the compound whose main chain is cleaved by irradiation with light and the polymer is not limited thereto.

Subsequently, the film forming step according to the invention will be described. The film forming step can be performed, for example, using a liquid crystal alignment agent varnish obtained by dissolving at least one compound which forms a liquid crystal alignment film in a solvent. For example, when the compound represented by the above chemical formula (1) is formed into a film, the film forming step can be performed using a liquid crystal alignment agent varnish obtained by dissolving a polyamic acid which is a precursor of the compound represented by the above chemical formula (1) in a solvent.

A polyimide as the compound represented by the above chemical formula (1) is insoluble in various petroleum solvents, and therefore it is difficult to directly add a polyimide to the liquid crystal alignment agent varnish. Therefore, a polyimide is added to the liquid crystal alignment agent varnish in the form of a polyamic acid and/or a polyamic acid ester, both of which are a polyimide precursor. That is, when a liquid crystal alignment film containing a polyimide as a main component is formed, a polyamic acid and/or a polyamic acid ester are/is contained in the liquid crystal alignment agent varnish.

The compound is not limited to a polyimide, and when a compound constituting the liquid crystal alignment film is insoluble in a solvent to be contained in the liquid crystal alignment agent varnish, the compound constituting the liquid crystal alignment film in the form of a precursor or the like may be contained in the liquid crystal alignment agent varnish as the compound forming the liquid crystal alignment film.

Further, the solvent to be contained in the liquid crystal alignment agent varnish can be appropriately changed according to the polymer constituting the liquid crystal alignment film.

The applying method of the liquid crystal alignment agent varnish is not limited to a specific method, and for example, the application can be performed using, for example, a cylinder-type pressing printer, an inkjet applicator, or the like. After the liquid crystal alignment agent varnish is applied to a substrate on which the liquid crystal alignment film is to be formed, heat is applied from outside to evaporate the solvent contained in the varnish, whereby the film can be formed.

After the liquid crystal alignment agent varnish is applied onto a predetermined substrate, the solvent contained in the varnish is evaporated, whereby the film can be formed.

Subsequently, the photo-alignment step according to the invention will be described. The photo-alignment step according to the invention is a photo-alignment step of imparting the alignment regulating force to the film formed in the film forming step by irradiation of the film with light in an atmosphere of a temperature lower than 100° C.

In the photo-alignment treatment, the polymer whose main chain is cleaved by irradiation with light contained in the film is considered to undergo three reactions as follows: (1) a reaction in which the polymer constituting the film photodegrades at a certain probability by irradiation with light; (2) a reaction in which the polymer having a molecular chain length reduced by the photodegradation is translocated due to thermal motion and rearranged; and (3) a reaction in which the rearranged polymer is crosslinked again at a certain probability.

Other than the polymer constituting the liquid crystal alignment film having a molecular chain length reduced by the photodegradation, a low-molecular weight component is also generated as a byproduct. This low-molecular weight component is, for example, a free component generated by photodegradation in the vicinity of the end of the polymer before irradiation with light, and does not contribute to the imparting of the alignment regulating force to the liquid crystal alignment film.

Further, the low-molecular weight component causes a decrease in the alignment regulating force of the liquid crystal alignment film. When the generated low-molecular weight component is crosslinked to a side chain of the polymer constituting the liquid crystal alignment film and remains there, it becomes a major cause of the decrease in the alignment regulating force. Further, if the low-molecular weight component is once crosslinked to a side chain of the polymer constituting the liquid crystal alignment film, it is extremely difficult to remove the crosslinked low-molecular weight component from the liquid crystal alignment film thereafter.

In the photo-alignment treatment according to the invention, the crosslinking reaction between the low-molecular weight component and a side chain of the polymer constituting the liquid crystal alignment film can be suppressed by irradiation with light in an atmosphere of a temperature lower than 100° C. That is, by irradiation with light, the generated low-molecular weight component remains in the liquid crystal alignment film in an uncrosslinked state.

The low-molecular weight component remaining in an uncrosslinked state also causes a decrease in the alignment regulating force of the liquid crystal alignment film and therefore should be removed. The step of removing this low-molecular weight component will be described in detail later.

Further, it is preferred that the photo-alignment step of imparting the alignment regulating force to the film formed in the film forming step is performed by irradiation of the film with light in an atmosphere of 75° C. or lower. Further, it is more preferred that light is irradiated in an atmosphere of 50° C. or lower, and it is particularly preferred that light is irradiated in an atmosphere of 25° C. or lower.

Examples of the light to be used in the photo-alignment treatment include ultraviolet light, infrared light, and visible light. In the manufacturing method of a liquid crystal display device according to an embodiment of the invention, it is preferred that the photo-alignment treatment is performed using polarized ultraviolet light obtained by substantially linearly polarizing ultraviolet light.

The same shall apply to the case where ultraviolet light is irradiated, and it is preferred that ultraviolet light is irradiated in an atmosphere of 75° C. or lower. Further, it is more preferred that ultraviolet light is irradiated in an atmosphere of 50° C. or lower, and it is particularly preferred that ultraviolet light is irradiated in an atmosphere of 25° C. or lower.

Subsequently, the removing step according to the invention will be described. By removing the low-molecular weight component which is uncrosslinked to the liquid crystal alignment film formed through the above-mentioned film forming step and photo-alignment step and remains on the surface of the liquid crystal alignment film, a higher alignment regulating force is imparted to the liquid crystal alignment film.

The alignment regulating force of the liquid crystal alignment film is strongly affected by the surface condition of the film. Therefore, it is necessary to remove the remaining low-molecular weight component from the surface of the liquid crystal alignment film in the removing step.

In other words, even if the low-molecular weight component remains in the inside of the formed liquid crystal alignment film, the low-molecular weight component remaining in the inside of the film does not largely affect the alignment regulating force as compared with the low-molecular weight component remaining on the surface. Therefore, the low-molecular weight component may remain in the inside of the liquid crystal alignment film even after the removing step.

Incidentally, for example, in the photo-alignment step, the light irradiation may be performed a plurality of times. In this case, the removing step may be performed each time after the light irradiation performed a plurality of times, and also may be performed only after the last light irradiation among the plurality of irradiation operations.

Further, in the removing step, it is preferred that the low-molecular weight component is removed by heating the film after the light irradiation. As for the heating method, for example, infrared heating, hot-air heating, hot-plate heating, or a combination of any of these methods can be appropriately performed.

As for the heating temperature, it is preferred that the heating is performed at a temperature not lower than the temperature at which the low-molecular weight component remaining on the surface of the film after the light irradiation evaporates. Further, it is preferred that the heating temperature is appropriately changed according to the physical property of the film after the light irradiation. For example, the upper limit of the heating temperature is preferably a temperature not higher than the softening point of the polymer which forms the film after the light irradiation.

Specifically, it is preferred that the low-molecular weight component is removed by heating the film after the light irradiation to a temperature within a range from 150° C. to 300° C. It is also preferred that the low-molecular weight component is removed by heating the surface of the film after the light irradiation to a temperature within a range from 150° C. to 300° C.

It is more preferred that the low-molecular weight component is removed by heating the surface of the film after the light irradiation to a temperature within a range from 200° C. to 290° C. in the removing step.

Further, it is preferred that the step of removing the low-molecular weight component by heating is performed for 5 minutes to 60 minutes. When the heating time is less than 5 minutes, the low-molecular weight component does not sufficiently evaporate and remains on the surface of the liquid crystal alignment film, and when the heating time is more than 60 minutes, the thermal deterioration of other members may be caused.

That is, in the removing step, it is particularly preferred that the low-molecular weight component is removed by heating the surface of the film after the light irradiation to a temperature within a range from 200° C. to 290° C. for 5 minutes to 15 minutes.

Further, it is preferred that the heating in the removing step is performed under a reduced pressure atmosphere. By performing the heating treatment under a reduced pressure atmosphere, the evaporation of the low-molecular weight component is accelerated, and therefore, the time of the removing step is reduced and the reliability of the removal is increased.

The "reduced pressure atmosphere" as used herein refers to an atmosphere having a pressure lower than the normal atmospheric pressure. That is, it is preferred that the heating in the removing step is performed under an atmosphere of about 100 kPa or less (lower than the normal atmospheric pressure). Further, it is particularly preferred that the heating in the removing step is performed under a vacuum atmosphere ($10^{-1}$ Pa or less).

Further, in the removing step, it is preferred that the low-molecular weight component is removed by washing the film after the light irradiation. As for the washing method, for example, washing with pure water, washing with a brush, ultrasonic washing, or a combination of any of these methods can be appropriately performed.

Further, it is preferred that the washing in the removing step is performed using a solution containing a water-soluble organic solvent.

Examples of the water-soluble organic solvent as used herein include alcohol compounds having a boiling point of 110° C. or lower such as methanol, ethanol, propanol (such as isopropyl alcohol), and butanol, low-boiling ketone compounds such as acetone, and water-soluble heterocyclic compounds having a boiling point of 250° C. or lower such as N-methylpyrrolidone and γ-butyrolactone.

The water-soluble organic solvent described above is illustrative only and is not limited to these compounds.

Further, it is preferred that the washing in the removing step is performed using a solution containing a surfactant.

Examples of the surfactant include nonionic surfactants such as polyoxyethylene alkyl ethers (such as polyoxyethylene lauryl ether, polyoxyethylene cetyl ether, and polyoxyethylene oleyl ether), polyoxyethylene alkyl aryl ethers, polyoxyethylene alkyl esters, polyoxyethylene alkylamine sorbitan fatty acid esters, and polyoxyethylene sorbitan fatty acid esters.

The surfactant described above is illustrative only and is not limited to these compounds.

Also from the viewpoint of handling property in the washing step, the surfactant is preferably any of the nonionic surfactants. However, for example, a cationic surfactant, an anionic surfactant, an amphoteric surfactant may be used within a range that does not impair the effect of the invention.

Further, the washing in the removing step may be performed using, for example, an aqueous solution in which a plurality of surfactants are mixed. That is, the washing in the removing step may be performed using an aqueous solution containing at least two or more surfactants. Further, the washing in the removing step may be performed using an aqueous solution containing a surfactant and a water-soluble organic solvent.

Incidentally, in the removing step, the low-molecular weight component may be removed by placing the film after the light irradiation under a reduced pressure atmosphere or vacuum ($10^{-1}$ Pa or lower).

The liquid crystal display device manufactured by any of the manufacturing methods described above can reduce a decrease in the image characteristic of a liquid crystal component.

Hereinafter, an example in which a polyimide represented by the following chemical formula (1) is used as the compound which forms the liquid crystal alignment film will be specifically described.

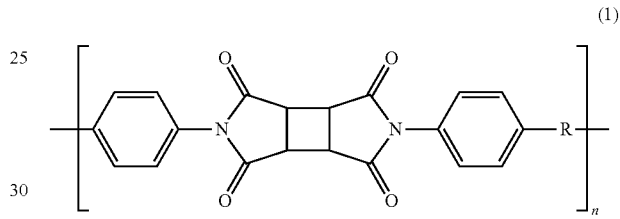

(1)

In the formula, R represents a divalent electron-donating organic group, and n represents the number of repeating units of the polymer and is preferably an integer of 100 to 1000.

It is known that the energy transfer of a cyclobutane ring from an aromatic imide ring is involved in the photodegradation of a cyclobutane ring which induces the alignment anisotropy of a polyimide-based liquid crystal alignment film having been subjected to the photo-alignment treatment.

Incidentally, in the compound represented by the chemical formula (1), in order to further facilitate the above-mentioned energy transfer, an electron-donating group (R) is chemically bonded in the vicinity of the aromatic imide ring.

In the compound represented by the above chemical formula (1), the photodegradation reaction of the cyclobutane ring proceeds more smoothly. Further, by appropriately changing the wavelength range or irradiation dose of the ultraviolet light, a preferred photodegradation reaction is achieved.

Examples of the group represented by R in the above chemical formula (1) include an amino group (—NH—) and an alkoxy group (—OC$_n$—H$_{2n}$—).

The functional groups described above are shown only as examples of the electron-donating group, and the electron-donating group is not limited to these functional groups.

Also in the case where the electron-donating group (R) is not chemically bonded in the vicinity of the aromatic imide ring of the compound represented by the above chemical formula (1), the photodegradation reaction of the cyclobutane ring is effected depending on the condition of the light irradiation or the like. That is, it is a more preferred condition that the electron-donating group (R) is chemically bonded in the vicinity of the aromatic imide ring of the compound represented by the above chemical formula (1).

Further, in order to decrease the irradiation dose of ultraviolet light required for alignment anisotropy (increase the sensitivity), it is necessary to optimize the baking degree and time which determine the imidization ratio so as to increase the imidization ratio and improve the efficiency of the above-mentioned energy transfer.

In order to form a liquid crystal alignment film having a high imidization ratio, first, it is necessary to accurately determine the conversion (imidization ratio) of a polyamic acid and/or a polyamic acid ester, both of which are a polyimide precursor, into a polyimide.

The imidization ratio is determined by comparing the intensity of a specific absorption peak (the stretching vibration of a benzene ring and a tertiary nitrogen atom: φ-N) in the IR spectrum of the baked liquid crystal alignment film with the φ-N absorption peak intensity of a liquid crystal alignment film baked at 300° C.

The imidization reaction does not necessarily proceed to 100%, and proceeds preferably to 40% to 100%, more preferably to 50% to 95%, further more preferably to 60% to 90% of the total reaction.

As the proceeding degree of the imidization reaction is higher, the photo-alignment property is increased and the liquid crystal alignment stability is increased. However, if it is too high, the resistivity of the liquid crystal alignment film is increased, and therefore it is not preferred from the viewpoint of an electrical characteristic.

Further, the molecular weight of the polyimide constituting an alignment control film is preferably higher, and a polyamic acid ester does not cause a decrease in the molecular weight during heating unlike a polyamic acid, and achieves high liquid crystal alignment stability, and therefore is more preferred.

As described above, the present inventors found that the decrease in the alignment regulating force is caused as follows. A polymer which photodegrades in a photo-alignment treatment produces a low-molecular weight component, which remains in a liquid crystal alignment film and causes a decrease in the alignment regulating force and also causes a decrease in the image characteristic of a liquid crystal component.

The liquid crystal display device according to an embodiment of the invention may be, for example, an in-plane switching (IPS) mode liquid crystal display device, a vertically aligned (VA) mode liquid crystal display device, a twisted nematic (TN) mode liquid crystal display device, or a liquid crystal display device employing other driving mode.

Incidentally, the remaining amount of the above-mentioned low-molecular weight component was calculated from the difference in the spectrum of a specific absorption peak intensity between before and after a predetermined step of removing the low-molecular weight component using FT-IR.

Further, as for an evaluation method for the alignment anisotropy of the liquid crystal alignment film, the evaluation was performed using the value of a polarized dichroic ratio. The polarized dichroic ratio is calculated from the following equation (I) using an absorbance at each wavelength obtained from the absorption spectra of both s-polarization and p-polarization.

$$\text{Polarized dichroic ratio} = (A_\perp - A_{//})/(A_\perp + A_{//}) \tag{I}$$

In the above equation (I), $A_{//}$ represents the absorbance of the liquid crystal alignment film in the direction parallel to the polarized light of the measuring light, and $A_\perp$ represents the absorbance in the direction perpendicular to the polarized light of the measuring light. In the invention, the alignment anisotropy of each liquid crystal alignment film was compared using the dichroic ratio at a wavelength which gives the maximum polarized dichroic ratio.

For example, when the polyimide-based liquid crystal alignment film is irradiated with polarized ultraviolet light, the number of polyimide molecules in the direction parallel to the electric field vector of the irradiation light is decreased and the alignment anisotropy is induced.

The absorbance $A_{//}$ measured by the polarized light in the direction parallel to the polarized irradiation light is smaller than the absorbance $A_\perp$ measured by the polarized light in the direction perpendicular to the polarized irradiation light, and therefore, the polarized dichroic ratio is larger than 0.

Further, $A_\perp$ and $A_{//}$ are proportional to the number of polyimide molecules in the liquid crystal alignment film, and therefore, as the polarized dichroic ratio of the liquid crystal alignment film is increased, the alignment anisotropy is increased.

Further, when the alignment anisotropy is increased, there is exhibited an effect that the intensity of an AC residual image (burn-in) can be significantly reduced.

Further, the anchoring strength of the liquid crystal alignment film is also an important factor required for the liquid crystal alignment film. The anchoring strength indicates the degree of binding of a liquid crystal molecule to the surface of the liquid crystal alignment film and also indicates the degree of resistance to a change in the azimuth and polar angle direction with respect to a force applied from outside in an interface between the liquid crystal molecule and the liquid crystal alignment film. An increase in the alignment anisotropy is an important factor for increasing the anchoring strength.

The liquid crystal display device according to an embodiment of the invention will be described with reference to FIG. 1, FIG. 2A, FIG. 2B, and FIG. 2C.

Figure 2A:
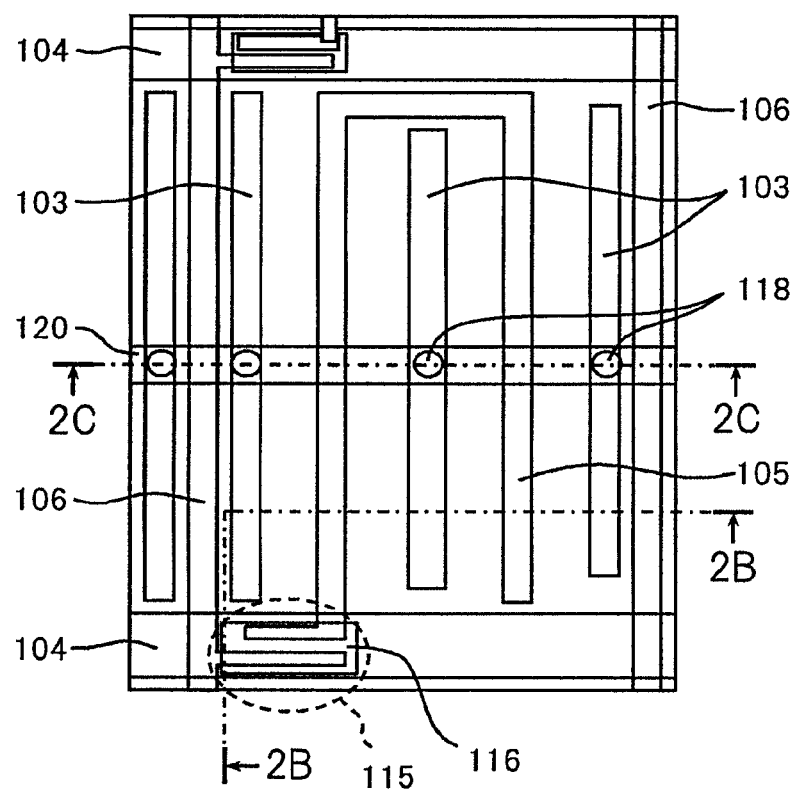
FIG. 2A is a plan view of a pixel portion illustrating the structure of a pixel of a liquid crystal display device according to an embodiment of the invention.
Figure 2B:
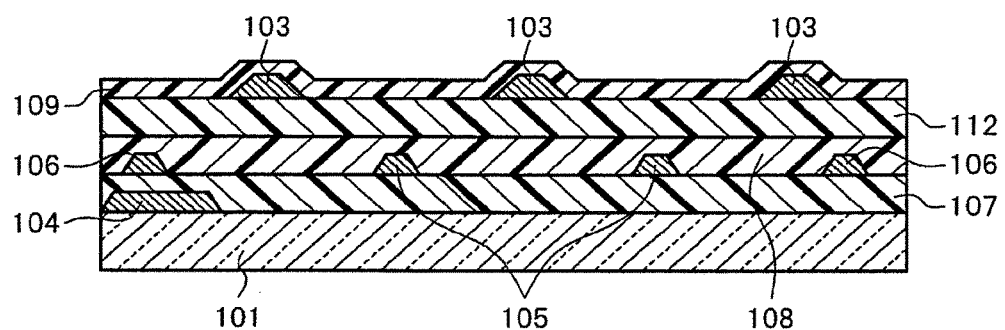
FIG. 2B is a cross-sectional view of a pixel portion illustrating the structure of a pixel of a liquid crystal display device according to an embodiment of the invention and is a view showing a cross-section along the line 2B-2B in FIG. 2A.
Figure 2C:
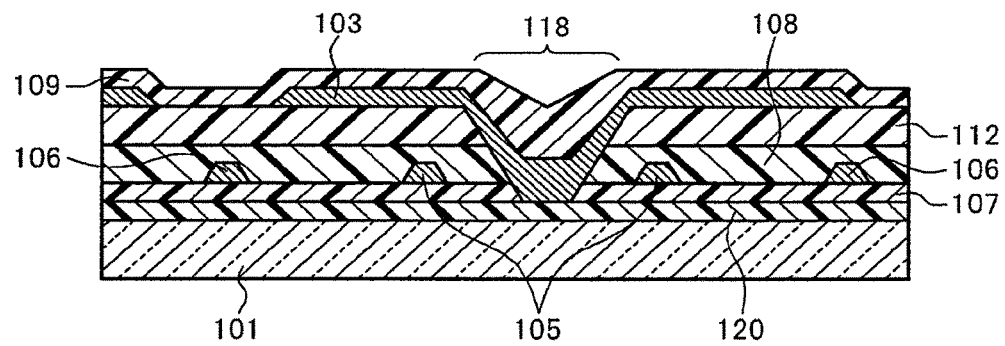
FIG. 2C is a cross-sectional view of a pixel portion illustrating the structure of a pixel of a liquid crystal display

FIG. 1 is a schematic cross-sectional view showing one pixel and the vicinity of one pixel of a liquid crystal display device according to the present embodiment. FIG. 2A to FIG. 2C are schematic views of an active matrix substrate illustrating the structure of one pixel and the vicinity of one pixel of a liquid crystal display device according to the present embodiment: FIG. 2A is a plan view; FIG. 2B is a cross-sectional view along the line 2B-2B in FIG. 2A; and FIG. 2C is a cross-sectional view along the line 2C-2C in FIG. 2A. Further, FIG. 1 corresponds to a portion of a cross-section along the line 2B-2B in FIG. 2A.

Further, FIG. 2B and FIG. 2C are schematic views with emphasis on the structure of a main portion and do not correspond one-to-one to the cross-sections taken along the lines 2B-2B and 2C-2C in FIG. 2A, respectively.

For example, in FIG. 2B, a semiconductor film 116 is not shown, and in FIG. 2C, among through holes 118 for connecting a common electrode 103 to a common electrode line (common line) 120, only one is representatively shown.

In this embodiment, a scan line (gate electrode line) 104 and a common electrode line 120, which are made of chromium (Cr), are disposed on a glass substrate 101 as the active matrix substrate, and a gate insulating film 107 made of silicon nitride is formed so as to cover the scan line 104 and the common electrode line 120.

Further, on the scan line 104, a semiconductor film 116 made of amorphous silicon or polysilicon is disposed through the gate insulating film 107. This semiconductor film 116 serves as the active layer of a thin film transistor (TFT) 115 as an active element.

Further, a signal line (drain electrode) 106 made of Cr—Mo (chromium-molybdenum) and a pixel electrode (source electrode) 105 made of an indium tin oxide (ITO) film are disposed so as to partly overlap the pattern of the semiconductor film 116. A protective insulating film 108 made of silicon nitride is formed so as to cover all of these members.

Further, as shown in FIG. 2C, the common electrode 103 connected to the common electrode line 120 is disposed on an organic protective film (overcoat layer) 112 via the through hole 118 formed through the gate insulating film 107 and the protective insulating film 108.

Further, as shown in FIG. 2A, the common electrodes 103 extending from the common electrode line 120 via the through holes 118 are disposed two-dimensionally in one pixel region such that they face the pixel electrode 105 of the pixel.

In this embodiment, the pixel electrodes 105 are disposed below the protective insulating film 108 which is disposed below the organic protective film 112, and the common electrodes 103 are disposed on the organic protective film 112.

A region sandwiched by these plural pixel electrodes 105 and the common electrodes 103 constitutes one pixel.

Further, a liquid crystal alignment film 109 is formed on the surface of the active matrix substrate having the thus constructed unit pixels disposed thereon in a matrix shape, that is, the liquid crystal alignment film 109 is formed on the organic protective film 112 on which the common electrodes 103 are formed.

Meanwhile, as shown in FIG. 1, a color filter layer 111 is disposed on the glass substrate 102 constituting an opposite substrate so as to be partitioned into sections for the individual pixels by a light shielding film (black matrix) 113. In addition, the color filter layer 111 and the light shielding film 113 are covered with the organic protective film 112 made of a transparent insulating material. Further, the liquid crystal alignment film 109 is formed also on the organic protective film 112 to constitute the color filter substrate.

To these liquid crystal alignment films 109, the liquid crystal alignment capability is imparted by irradiation with linearly polarized ultraviolet light obtained from a low-pressure mercury-xenon lamp as a light source using a pile polarizer obtained by laminating quartz plates.

The glass substrate 101 constituting the active matrix substrate and the glass substrate 102 constituting the color filter substrate are disposed so as to face each other with respect to the surfaces of the liquid crystal alignment films 109, respectively, and a liquid crystal layer (liquid crystal composition layer) 110*b* composed of liquid crystal molecules 110*a* is disposed between the glass substrates.

Further, the glass substrate 101 constituting the active matrix substrate and the glass substrate 102 constituting the color filter substrate have polarizing plates 114 formed on the outer surfaces thereof, respectively.

As described above, an active matrix type liquid crystal display device using TFT 115 (TFT liquid crystal display device) is constructed. In this TFT liquid crystal display device, when no electric field is applied, the liquid crystal molecules 110*a* constituting the liquid crystal composition layer 110*b* are aligned substantially in parallel to the surfaces of the glass substrates 101 and 102 disposed so as to face each other, and are homogeneously aligned in an initial alignment direction determined by the photo-alignment treatment.

When TFT 115 is turned on by applying a voltage to the scan line 104, an electric field (applied voltage) 117 is applied to the liquid crystal composition layer 110*b* due to the electric potential difference between the pixel electrode 105 and the common electrode 103, and the liquid crystal molecules 110*a* constituting the liquid crystal composition layer 110*b* turn in the direction of the electric field due to the interaction between the dielectric anisotropy of the liquid crystal composition layer 110*b* and the electric field. In this case, the light transmittance of the liquid crystal display device is changed by the refractive anisotropy of the liquid crystal composition layer 110*b* and the action of the polarizing plates 114, whereby display can be carried out.

The organic protective film 112 may be made of a thermosetting resin such as an acrylic resin, an epoxy-acrylic resin, or a polyimide resin having excellent insulating property and transparency. The organic protective film 112 may also be made of a photo-curable transparent resin or an inorganic material such as a polysiloxane resin. Further, the organic protective film 112 may serve also as the liquid crystal alignment film 109.

As described above, according to the present embodiment, it is possible to impart uniform alignment to the entire display region without causing local alignment disturbance near the electrodes by adopting a non-contact photo-alignment treatment, not a rubbing alignment treatment in which the ability to align liquid crystal molecules of the liquid crystal alignment film 109 is imparted by direct rubbing with a buff cloth.

In general, it is known that, unlike the vertical electric field mode typified by the conventional TN mode, the IPS mode fundamentally does not require an interface tilt with respect to the surface of a substrate and as the interface tilt angle is smaller, the visual angle characteristic is higher. Also in a liquid crystal alignment film having been subjected to a photo-alignment treatment, a small interface tilt angle is preferred, and the interface tilt angle of 1 degree or less is particularly effective, since the thus-formed liquid crystal display device can remarkably suppress the color and luminance changes depending on the viewing angles.

Subsequently, a specific manufacturing method according to this embodiment will be described. As the glass substrate 101 constituting the active matrix substrate and as the glass substrate 102 constituting the color filter substrate, a surface-polished glass substrate having a thickness of 0.7 mm is used.

The TFT 115 to be formed on the glass substrate 101 is composed of the pixel electrode 105, signal line 106, scan line 104, and semiconductor film 116 made of amorphous silicon.

All of the scan line 104, common electrode line 120, and signal line 106 were formed by patterning a chromium film, and the distance between the pixel electrode 105 and the common electrode 103 was set to 7 μm. Incidentally, in this embodiment, the common electrode 103 and the pixel electrode 105 are made of an ITO film by forming transparent electrodes for achieving a higher luminance characteristic. However, it is also possible to form the common electrode 103 and the pixel electrode 105 of a chromium film which has low resistivity and facilitates patterning in place of an ITO film.

The gate insulating film 107 and the protective insulating film 108 were made of silicon nitride and the thickness of each of these films was set to 0.3 μm. An acrylic resin was applied thereto and treated by heating to 220° C. for 1 hour, thereby forming an organic protective film 112 which was transparent and had an insulating property.

Subsequently, as shown in FIG. 2C, the through hole 118 was formed down to the common electrode line 120 by photolithography and etching treatment, and the common electrode 103 connected to the common electrode line 120 was formed by patterning.

As a result, in a unit pixel (one pixel), as shown in FIG. 2A, the pixel electrode 105 was disposed among the three common electrodes 103, and an active matrix substrate having 1024×3×768 pixels, namely, pixels composed of 1024×3 (corresponding to R, G, and B) signal lines 106 and 768 scan lines 104 was formed.

Example 1

A film containing a compound represented by the following chemical formula (2) was formed on a glass substrate having a comb-like electrode ITO pattern by spin-coating a liquid crystal alignment agent varnish containing a precursor of the compound represented by the following chemical formula (2), followed by heating to 230° C.

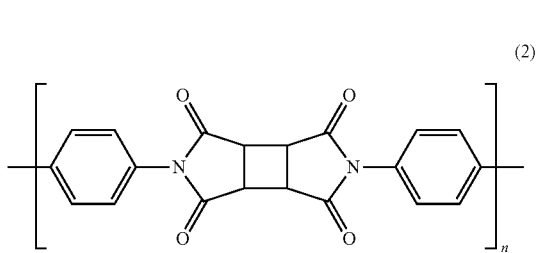

(2)

The film containing the compound represented by the above chemical formula (2) formed on the substrate having a comb-like electrode was irradiated with polarized ultraviolet light at a wavelength of 257 nm such that the illumination intensity and time were adjusted so as to give an exposure dose of 1 J/cm². When the polarized dichroic ratio of a carbonyl group at a wavelength of 1710 cm$^{-1}$ was determined from the difference spectrum of the polarized spectrum, it was found to be 0.10.

On the other hand, after the irradiation with polarized ultraviolet light, the surface of the film having undergone the irradiation with ultraviolet light was heated to 230° C. for 10 minutes, and then, the polarized dichroic ratio was determined in the same manner with polarized FT-IR and found to be 0.14.

The increase in the polarized dichroic ratio by the heating to 230° C. is due to the evaporation of the photodegraded product (low-molecular weight component).

Further, the above-mentioned two substrates were bonded to each other using a sealing material containing beads, a commercially available liquid crystal was introduced into the space between the two substrates, and a completely sealed unit cell was prepared.

When the anchoring strength between the liquid crystal alignment film and the liquid crystal was measured using this unit cell, it was found that the anchoring effect in the case of using the substrate obtained by heating to 230° C. for 10 minutes after the irradiation with polarized ultraviolet light was about 1.4 times higher than that in the case of using the substrate obtained without heating.

As a comparative example, a liquid crystal alignment film was prepared by subjecting a film formed by the same coating step as described above to a photo-alignment treatment through irradiation with polarized ultraviolet light at 200° C. Then, the polarized dichroic ratio was determined for the thus obtained liquid crystal alignment film and found to be 0.1.

The anchoring strength in the case of using the liquid crystal alignment film of the comparative example was found to be about half of that in the case of using the substrate obtained by heating to 230° C. for 10 minutes after the irradiation with polarized ultraviolet light.

Example 2

A film containing a compound represented by the following chemical formula (1) was formed on a glass substrate having a comb-like electrode ITO pattern by spin-coating a liquid crystal alignment agent varnish containing a precursor of the compound represented by the following chemical formula (1), followed by heating to 230° C. R in the chemical formula (1) is an electron-donating group.

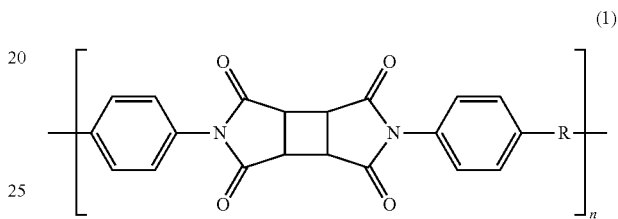

(1)

The film formed on the substrate having a comb-like electrode was irradiated with polarized ultraviolet light at a wavelength of 257 nm such that the illumination intensity and time were adjusted so as to give an exposure dose of 1 J/cm². When the polarized dichroic ratio of a carbonyl group at a wavelength of 1710 cm$^{-1}$ was determined from the difference spectrum of the polarized spectrum, it was found to be 0.05.

On the other hand, after the irradiation with polarized ultraviolet light, the surface of the film having undergone the irradiation with ultraviolet light was heated to 230° C. for 10 minutes, and then, the polarized dichroic ratio was determined in the same manner with polarized FT-IR and found to be 0.23.

The increase in the polarized dichroic ratio by the heating to 230° C. is due to the evaporation of the photodegraded product (low-molecular weight component).

Further, the above-mentioned two substrates were bonded to each other using a sealing material containing beads, a commercially available liquid crystal was introduced into the space between the two substrates, and a completely sealed unit cell was prepared.

When the anchoring strength between the liquid crystal alignment film and the liquid crystal was measured using this unit cell, it was found that the anchoring effect in the case of using the substrate obtained by heating to 230° C. for 10 minutes after the irradiation with polarized ultraviolet light was about 4 times higher than that in the case of using the substrate obtained without heating.

As a comparative example, a liquid crystal alignment film was prepared by subjecting a liquid crystal alignment film formed by the same coating step as described above to a photo-alignment treatment through irradiation with polarized ultraviolet light at 200° C. Then, the polarized dichroic ratio was determined for the thus obtained liquid crystal alignment film and found to be 0.1.

The anchoring strength in the case of using the liquid crystal alignment film of the comparative example was found to be about half of that in the case of using the substrate obtained by heating to 230° C. for 10 minutes after the irradiation with polarized ultraviolet light.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A manufacturing method of an in-plane switching mode liquid crystal display device comprising:
    a photo alignment film forming step comprising:
    forming a film formed of polyimide having a cyclobutane structure from one of a polyamic acid and a polyamic acid ester;
    cleaving the cyclobutane structure of the film by irradiation with light in an atmosphere having a temperature lower than 100° C.; and
    removing a low-molecular weight component having a maleimide end which is cleaved from the cyclobutane structure of the film by the light irradiation,
    wherein the photo alignment film aligns liquid crystal molecules substantially in parallel with a surface of a substrate,
    wherein the removing step comprises washing the film using a solution containing a water and a solvent, and
    wherein the polyimide is represented by chemical formula (1),

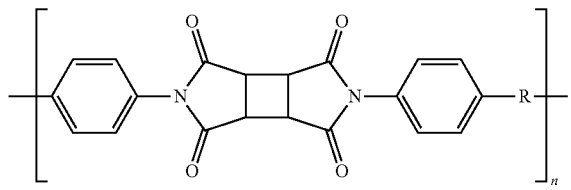

(1)

in the formula, R represents a divalent electron donating organic group and n represents the number of repeating units of the polymer.

2. The manufacturing method of an in-plane switching mode liquid crystal display device according to claim 1, wherein the solvent includes an alcohol compound having a boiling point of 110° C. or lower.

3. The manufacturing method of an in-plane switching mode liquid crystal display device according to claim 1, wherein the solvent includes a low-boiling ketone compound.

4. The manufacturing method of an in-plane switching mode liquid crystal display device according to claim 1, wherein the removing step further comprises washing with pure water.

5. The manufacturing method of an in-plane switching mode liquid crystal display device according to claim 4, wherein the solvent includes an alcohol compound having a boiling point of 110° C. or lower.

6. The manufacturing method of an in-plane switching mode liquid crystal display device according to claim 4, wherein the solvent includes a low-boiling ketone compound.

7. The manufacturing method of an in-plane switching mode liquid crystal display device according to claim 1, wherein the cleaving the cyclobutane structure of the film by irradiation with light is performed in an atmosphere having a temperature lower than 75° C.

8. The manufacturing method of an in-plane switching mode liquid crystal display device according to claim 7, wherein the removing step further comprises washing with pure water.

9. The manufacturing method of an in-plane switching mode liquid crystal display device according to claim 1, wherein the cleaving the cyclobutane structure of the film by irradiation with light is performed in an atmosphere having a temperature lower than 50° C.

10. The manufacturing method of an in-plane switching mode liquid crystal display device according to claim 9, wherein the removing step further comprises washing with pure water.

11. The manufacturing method of an in-plane switching mode liquid crystal display device according to claim 1, wherein the solvent includes a surfactant.

12. The manufacturing method of an in-plane switching mode liquid crystal display device according to claim 1, wherein the R is an amino group or an alkoxy group.

* * * * *